US007388421B1

(12) United States Patent
DeStasi

(10) Patent No.: US 7,388,421 B1
(45) Date of Patent: Jun. 17, 2008

(54) FUSED TRIM CIRCUIT WITH TEST EMULATION AND REDUCED STATIC CURRENT DRAIN

(75) Inventor: Frank J. DeStasi, San Leandro, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/466,644

(22) Filed: Aug. 23, 2006

(51) Int. Cl.
*H01H 37/76* (2006.01)

(52) U.S. Cl. ...................................................... 327/525

(58) Field of Classification Search ................ 327/524, 327/525, 526

See application file for complete search history.

(56) References Cited

U.S. PATENT DOCUMENTS

| | | | | |
|---|---|---|---|---|
| 4,686,384 | A * | 8/1987 | Harvey et al. | 327/530 |
| 5,663,658 | A * | 9/1997 | Cowles et al. | 326/10 |
| 5,986,321 | A | 11/1999 | Froehner | |
| 6,566,729 | B1 | 5/2003 | Okada et al. | |
| 6,728,158 | B2 * | 4/2004 | Takahashi et al. | 365/225.7 |

OTHER PUBLICATIONS

Price, John J.; "A Passive Laser-Trimming Technique to Improve the Linearity of a 10-Bit D/A Converter," IEEE Journal of Solid-State Circuits, vol. SC-11, No. 6, Dec. 1976, pp. 789-794.

Kothandaraman et al.: "Electrically Programmable Fuse (eFUSE) Using Electromigration in Silicides," IEEE Electron Device Letters, vol. 23, No. 9, Sep. 2002, pp. 523-525.

* cited by examiner

*Primary Examiner*—Jeffrey S Zweizig
(74) *Attorney, Agent, or Firm*—Darby & Darby PC; John W. Branch

(57) ABSTRACT

A trim circuit that is operable to adjust (trim) a digital or analog output of another electronic circuit, e.g., a regulator, comparator, signal processor, and the like. The novel trim circuit includes two fuses that can be separately "blown" or severed in such a way as to provide a relatively fixed "high" or "low" output signal that can be employed to adjust/trim the digital or analog output of another electronic circuit. A first fuse is coupled to a high potential of the trim circuit and the second fuse is coupled to a low potential of the trim circuit. If the second fuse is blown/cut, the trim circuit provides a relatively fixed high output signal. Conversely, if the first fuse is blown/cut, the trim circuit provides a relatively fixed low output signal. The fuses typically operate as relatively low impedance current shunts until they are severed/cut.

13 Claims, 3 Drawing Sheets

FUSED TRIM CIRCUIT WITH TEST EMULATION AND REDUCED STATIC CURRENT DRAIN

FIELD OF THE INVENTION

The invention is generally directed to trimming the operation of electronic components, and more particularly, a trim circuit that both enables a tester to emulate its operation prior to configuration and prevents static current drain during operation.

BACKGROUND OF THE INVENTION

An integrated electronic circuit typically includes several electronic components that are arranged to enable the circuit's functionality. However, the actual operation of each integrated circuit can vary based on a variety of factors, including manufacturing processes, and component layout. Consequently, prior to providing the integrated circuit to a customer, a test engineer will often emulate an output of an integrated circuit and subsequently adjust (trim) the output to conform to a desired operational range and/or accuracy. However, the typical arrangement of electronic components for trimming the output of an integrated circuit and/or enabling its emulation can lead to undesirable static current drains in the circuit.

BRIEF DESCRIPTION OF THE DRAWINGS

For a better understanding of the present invention, reference will be made to the following detailed description, which is to be read in association with the accompanying drawings, wherein.

DETAILED DESCRIPTION OF THE INVENTION

Figure 1:
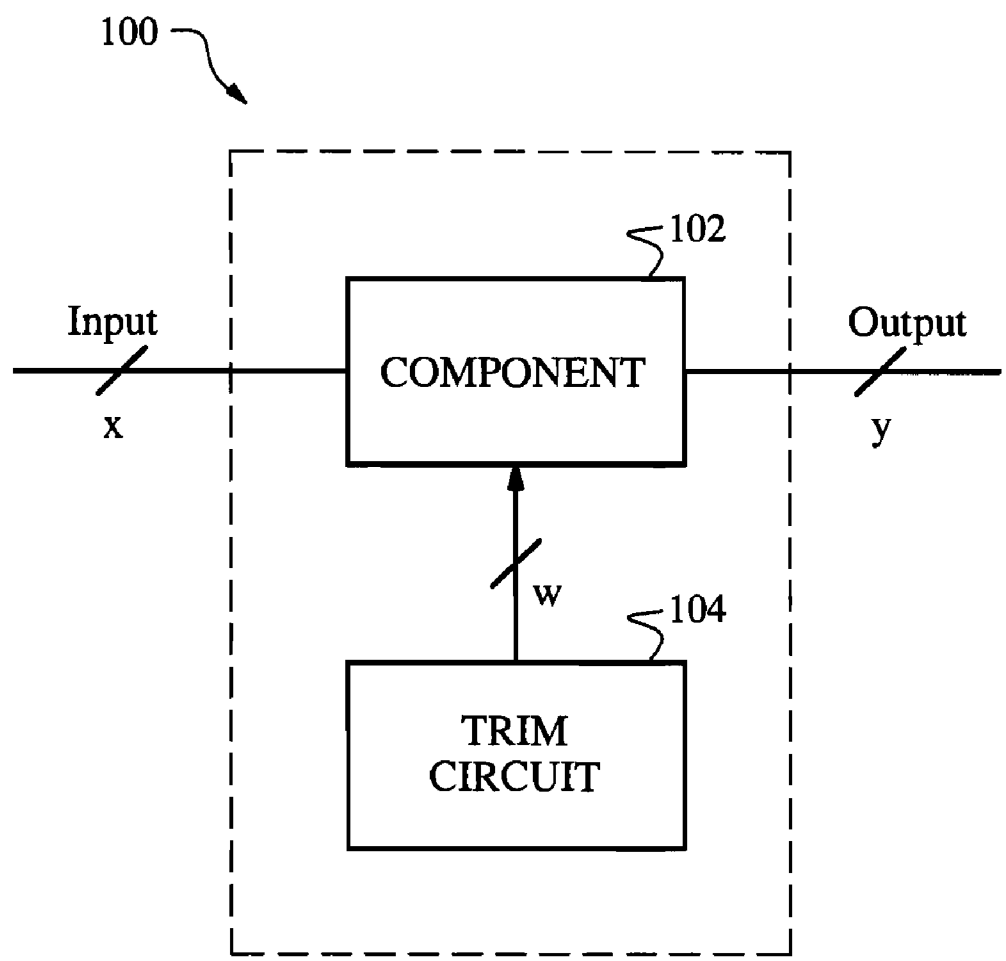
FIG. 1 is a block diagram of an integrated circuit whose output is adjustable with a trim circuit.

In the following detailed description, reference is made to the accompanying drawings, in which are shown exemplary but non-limiting and non-exhaustive embodiments of the invention. These embodiments are described in sufficient detail to enable those having skill in the art to practice the invention, and it is understood that other embodiments may be used, and other changes may be made, without departing from the spirit or scope of the invention. The following detailed description is, therefore, not to be taken in a limiting sense, and the scope of the invention is defined only by the appended claims. In the accompanying drawings, like reference numerals refer to like parts throughout the various figures unless otherwise specified.

Briefly, the invention is directed to a novel trim circuit that is operable to adjust (trim) a digital or analog output of another electronic circuit, e.g., a regulator, comparator, signal processor, and the like. The novel trim circuit includes two fuses that can be separately "blown" or severed in such a way as to provide a relatively fixed "high" or "low" output signal that can be employed to adjust/trim the digital or analog output of another electronic circuit. A first fuse is coupled to a high potential of the trim circuit and the second fuse is coupled to a low potential of the trim circuit. If the second fuse is blown/cut, the trim circuit provides a relatively fixed high output signal. Conversely, if the first fuse is blown/cut, the trim circuit provides a relatively fixed low output signal. The fuses typically operate as relatively low impedance current shunts until they are severed/cut.

A current source is coupled between the first fuse and the high potential of the trim circuit. The current source can be arranged to conserve energy in the trim circuit by limiting the flow of current in the trim circuit. Also, in at least one embodiment, the current source can be turned on and off to determine if the first ("high") fuse or the second ("low") fuse was actually blown/cut or not. In particular, if a change in the quiescent current of the trim circuit is detected when the current source is cycled on and off, then the first fuse is most likely not blown. Additionally, in at least one embodiment, a single current source could be shared with multiple instances of the trim circuit that are arranged to provide multiple output signals for trimming multiple digital bits/analog signals in another electronic circuit. In yet other embodiments, separate current sources could be arranged to provide current to each instance of the novel trim circuit.

At least one logic gate is provided to enable a tester to emulate an output of the trim circuit with data. In this way, a temporary arrangement of the trim circuit's fuses can be emulated for testing the optimal amount of trim to be provided to another electronic circuit. Once trim testing is complete, a substantially permanent configuration of the fuses is established by blowing/cutting one of them. In one embodiment, at least one logic gate is de-energized to further conserve energy after the fuses are permanently configured/cut/blown. In at least one embodiment, the testing is performed by an operator, and in at least another embodiment, an automated testing apparatus is employed.

In one embodiment, the two fuses within the trim circuit can be separately blown by a laser. The two fuses are further arranged to help dissipate excess charge that could accumulate if a laser is employed to blow/cut one of the fuses. Also, the power consumption of the trim circuit is reduced in part because the arrangement of the two fuses enables reduction in the number of other components that can consume at least some energy.

FIG. 1 illustrates a block diagram for an exemplary environment for at least one embodiment of the invention. As shown, electronic component 102 is an integrated circuit that is arranged with input lines and output lines for handling data, e.g., a regulator, comparator, signal processor, and the like. Furthermore, exemplary component 102 can be any type of integrated circuit whose output can be adjusted by one or more trim signals received over one or more trim lines from trim circuit 104. Trim circuit 104 may include one or more instances of the invention that each provide a signal for at least one of the trim lines.

Additionally, although not shown, at least one data line and at least one enable line are provided for enabling a tester to emulate/simulate the output provided by the trim lines to component 102 prior to configuring the fuses in trim circuit 104.

Figure 2:
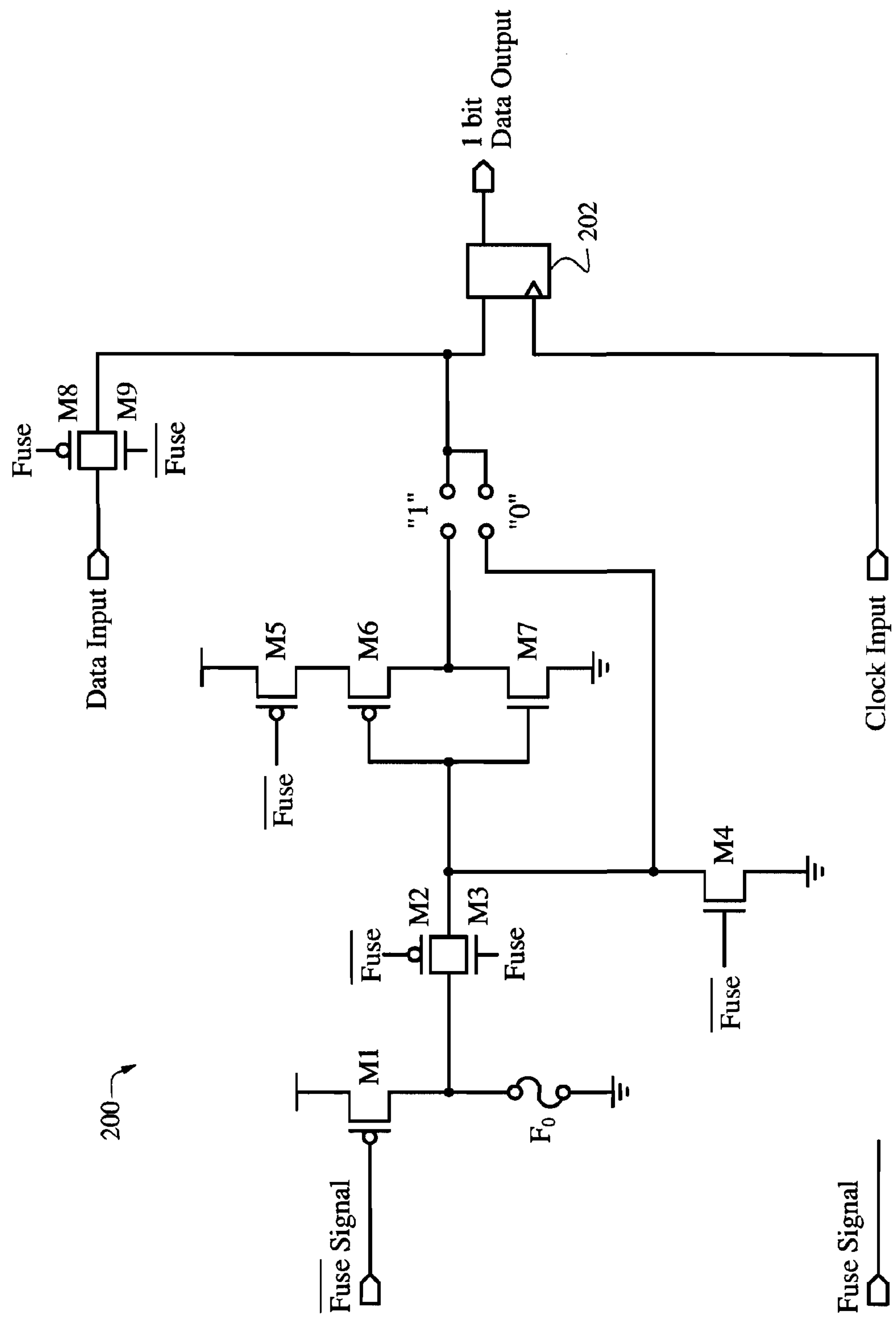
FIG. 2 is a schematic diagram of a one bit trim circuit with components for arranging for emulation and one fuse arranged for configuring either a high and low state latched output.

FIG. 2 illustrates a schematic of an exemplary trim circuit 200 with at least some portion that was previously known, which includes only one fuse (F0) for configuring a single data output trim signal. As shown, a plurality of MOSFETs (M1, M2, M3, M4, M5, M6, M7, M8, and M9) are configured to operate trim circuit 200. Also, a fuse signal and a clock signal are employed to control the operation of the MOSFETs. Additionally, the clock signal is employed to control the operation of latch 202, which latches the data output trim signal provided for subsequent trimming of the operation/output of a separate electronic circuit/integrated circuit (not shown).

Data input line is provided for causing the emulation of the output trim signal of trim circuit 200. A tester can employ the data input line to switch the state of the trim output signal for at least determining whether or not to blow/cut fuse F0. However, if power is cycled off and on, a power-on-reset signal is typically provided to enable latch 202 to once again latch the data output trim signal. Additionally, the operation of the plurality of MOSFETs and latch can consume power even though the data output trim signal is relatively constant.

Figure 3:
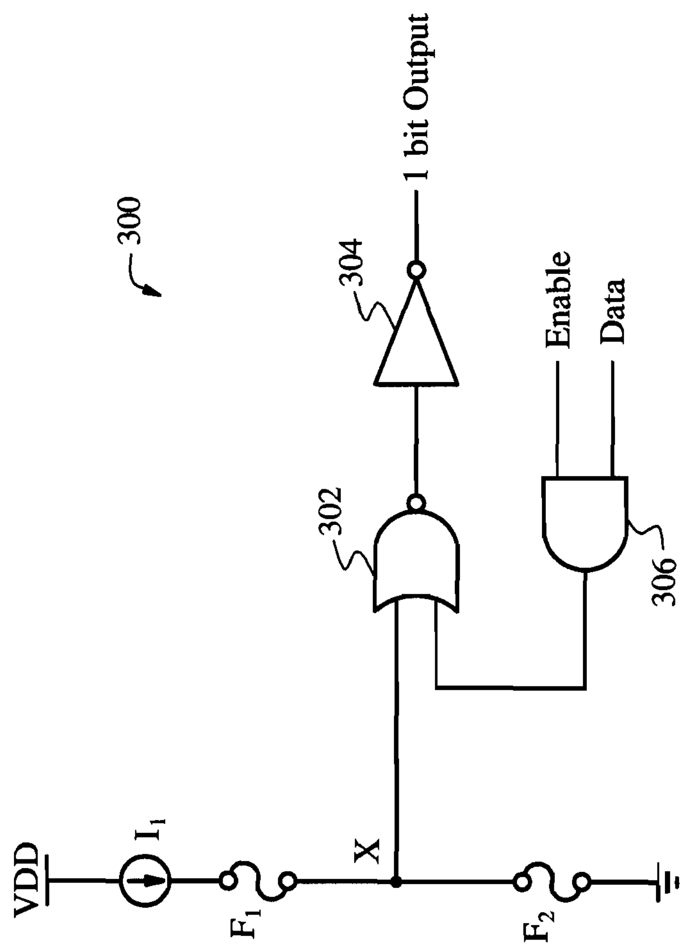
FIG. 3 is a schematic diagram of a one bit trim circuit with components for arranging for emulation and two separate fuses arranged for configuring either a high or low static output, in accordance with the invention.

FIG. 3 shows a schematic for exemplary trim circuit 300 that provides a single bit for a data output trim signal. One end of current supply I1 is coupled to the upper rail of a power supply (not shown) for trim circuit 300, and the other end is coupled to an end of fuse F1. An end of fuse F2 is coupled to the lower rail of the trim circuit's power supply and the other end of the fuse is coupled to the other end of fuse F1 and an input to NOR gate 302 at node X. An output of NOR gate 302 is coupled to an input of inverter gate 304. Also, an output of AND gate 306 is coupled to another input to NOR gate 302. An enable signal and a data signal are separately coupled at inputs to AND gate 306. Furthermore, an output of inverter gate 304 provides a single data output trim signal for another electronic circuit/integrated circuit that is not shown.

Prior to blowing/cutting one of fuses F1 and F2, a tester can assert the enable signal and toggle the data signal to emulate the data output trim signal that would be provided if either of the fuses is blown/cut. For example, if fuse F1 is cut/blown, the data output trim signal would be pulled low. Conversely, if fuse F2 is cut/blown, the data output trim signal would be pulled high.

Additionally, the arrangement of the fuses serves to bleed off charge that might accumulate from the use of a laser to blow/cut one of the fuses. Also, the arrangement of current source 11 can serve to regulate/limit the amount of current that flows through trim circuit 300 if fuse F2 is cut/blown and fuse F1 is not severed (high data output trim signal). Moreover, to further reduce the consumption of energy, AND gate 306 can be disabled after the data output trim signal is fixed by the cutting/blowing of one of the fuses.

Also, in at least one embodiment, current source 11 can be turned on and off to determine if fuse F1 or F2 was actually blown/cut or not. In particular, if a change in the quiescent current of the trim circuit is detected when the operation of the current source is cycled on and off, then fuse F1 is most likely not blown. In at least one embodiment, the cycling of the current source can be arranged as a PMOS transistor that conducts and then turns off in its triode region of operation. Furthermore, in at least one embodiment, the testing is performed by an operator, and in at least another embodiment, an automated testing apparatus is employed.

Although not shown, in one or more embodiments, multiple data output trim signals can be provided by paralleling multiple instances of trim circuit 300. Also, a single current source could be used for all instances of the trim circuit. In this way, a further reduction in energy consumption, and circuit complexity could be realized. Additionally, a single current source could further enable a relatively stable data output trim signal for multiple instances of the trim circuit.

Accordingly, the above specification, examples, and data provide a complete description of the manufacture and use of the composition of the invention. Since many embodiments of the invention can be made without departing from the spirit and scope of the invention, the invention resides in the claims hereinafter appended.

The invention claimed is:

1. A circuit for providing a trim signal, comprising:

a current source coupled to an end of a first fuse, wherein an opposite end of the first fuse is coupled to a first input of a first logic gate, and wherein the current source is arranged for separate cycling between on and off states;

a second fuse coupled between the first input of the first logic gate and a common potential;

a buffer gate with an input that is coupled to an output of the first logic gate, wherein severing one of the first fuse or the second fuse enables an output of the buffer gate to be provided as the trim signal; and a second logic gate with an output coupled to a second input of the first logic gate, wherein a first input of the second logic gate is coupled to an enable signal and a second input of the second logic gate is coupled to a data signal, and wherein the configuration of the enable signal and the data signal enables a state of the trim signal to emulate a result of severing one of the first fuse or the second fuse prior to doing so.

2. The circuit of claim 1, wherein the second logic gate is turned off to conserve power after one of the first fuse or the second fuse are actually severed.

3. The circuit of claim 1, wherein the operation of the current source is arranged for separate cycling between the on and off states to enable a determination as to whether one of the first fuse or the second fuse is actually severed.

4. The circuit of claim 1, further comprising an upper rail of a power supply that is coupled to the current source.

5. The circuit of claim 1, wherein the first fuse and the second fuse are arranged for severing by at least a laser.

6. The circuit of claim 1, wherein the first logic gate is arranged as at least one of a NOR gate.

7. The circuit of claim 1, wherein the second logic gate is arranged as at least one of an AND gate.

8. The circuit of claim 1, wherein the buffer is arranged as at least one of a logic inverter gate.

9. A circuit for providing a signal to trim an output of an integrated circuit, comprising:

a current source coupled between an upper rail of a power supply and an end of a first fuse, wherein an opposite end of the first fuse is coupled to a first input of a NOR logic gate, and wherein the current source is arranged for separate cycling between on and off states;

a second fuse coupled between the first input of the NOR logic gate and a lower rail of the power supply; and an inverter gate with an input that is coupled to an output of the NOR logic gate, wherein severing one of the first fuse or the second fuse enables an output of the inverter gate to be provided as the signal to trim the integrated circuit's output.

10. The circuit of claim 9, further comprising an AND logic gate with an output coupled to a second input of the NOR logic gate, wherein a first input of the AND logic gate is coupled to an enable signal and a second input of the second logic gate is coupled to a data signal, and wherein the configuration of the enable signal and the data signal enables a state of the trim signal to emulate a result of severing one of the first fuse or the second fuse prior to doing so.

11. The circuit of claim 10, wherein the AND logic gate is turned off to conserve power after one of the first fuse or the second fuse is actually severed.

12. The circuit of claim 10, wherein the operation of the current source is arranged for separate cycling between the on and off states to enable a determination as to whether one of the first fuse or the second fuse is actually severed.

13. An integrated circuit that enables trimming of its output, comprising:

a current source coupled between an upper rail of a power supply and an end of a first fuse, wherein an opposite end of the first fuse is coupled to a first input of a NOR logic gate, and wherein the current source is arranged for separate cycling between on and off states;

a second fuse coupled between the first input of the NOR logic gate and a lower rail of the power supply; and an inverter gate with an input that is coupled to an output of the NOR logic gate, wherein severing one of the first fuse or the second fuse enables an output of the inverter gate to be provided as the signal to trim the integrated circuit's output.

* * * * *